(12) United States Patent
Lokere et al.

(10) Patent No.: US 9,240,718 B2
(45) Date of Patent: Jan. 19, 2016

(54) ACCURATE CURRENT SENSING IN H-BRIDGE APPLICATIONS WITHOUT AMPLIFIER HAVING HIGH COMMON MODE REJECTION RATIO

(71) Applicant: Linear Technology Corporation, Milpitas, CA (US)

(72) Inventors: Kristiaan B. Lokere, Westford, MA (US); Brendan J. Whelan, Brentwood, CA (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 103 days.

(21) Appl. No.: 14/148,550

(22) Filed: Jan. 6, 2014

(65) Prior Publication Data

US 2015/0048770 A1 Feb. 19, 2015

Related U.S. Application Data

(60) Provisional application No. 61/866,334, filed on Aug. 15, 2013.

(51) Int. Cl.
*H02P 7/18* (2006.01)
*H02M 3/158* (2006.01)
(Continued)

(52) U.S. Cl.
CPC ............ *H02M 3/158* (2013.01); *G01R 19/0092* (2013.01); *H02P 31/00* (2013.01); *G01R 1/203* (2013.01); *G01R 19/16538* (2013.01); *G01R 31/40* (2013.01)

(58) Field of Classification Search
CPC ...................... G01R 19/0092; G01R 19/16538; G01R 1/203; H02M 3/158; H02P 31/00; H02P 7/265; H02P 7/28; H03F 3/45475; H03F 3/45968
USPC ...................... 318/504, 678; 323/299; 330/69; 324/416, 522, 525; 340/635; 388/822, 388/823
See application file for complete search history.

(56) References Cited

U.S. PATENT DOCUMENTS 2,873,417 A * 2/1959 Wilkins .................. H02P 7/265
388/822
4,608,524 A * 8/1986 Yokobori ................ G05F 1/561
318/400.04
(Continued)

FOREIGN PATENT DOCUMENTS

EP 0827266 A2 3/1998
EP 1428314 B1 3/2009
EP 2840407 A1 2/2015

OTHER PUBLICATIONS

Intersil. 2013. Micropower, Rail to Rail Input Current Sense Amplifier with Voltage Output: ISL28006. Technical Data Sheet, Intersil Americas LLC, Nov. 22, 2013, 26 pages.
(Continued)

*Primary Examiner* — Rita Leykin
(74) *Attorney, Agent, or Firm* — McDermott Will & Emery LLP

(57) ABSTRACT

A current sensing circuit may include a shunt resistance through which current to be sensed travels. A first and a second differential amplifier may each provide an amplified output of the voltage across the shunt resistance. A switching system may deliver a current sensing signal output based on the amplified output of the first differential amplifier when the common mode voltage across the shunt resistance is low and based on the amplified output of the second differential amplifier when the common mode voltage across the shunt resistance is high. The first differential amplifier may provide its lowest output DC offset voltage when the common mode voltage is low, while the second differential amplifier may provide its lowest output DC offset voltage when the common mode voltage is high. The first and second differential amplifiers may both have a low common mode voltage rejection ratio, such as a ratio of less than 40 db at the switching frequency of switches that control the current that is sensed.

20 Claims, 3 Drawing Sheets

(51) Int. Cl.
  *H02P 31/00* (2006.01)
  *G01R 19/00* (2006.01)
  *G01R 31/40* (2014.01)
  *G01R 1/20* (2006.01)
  *G01R 19/165* (2006.01)

(56) References Cited

U.S. PATENT DOCUMENTS

| | | | | |
|---|---|---|---|---|
| 4,764,720 | A | * | 8/1988 | Nystrom ............... 324/107 |
| 4,933,642 | A | | 6/1990 | Lee |
| 5,266,888 | A | * | 11/1993 | Aslan ............... 324/95 |
| 5,552,684 | A | * | 9/1996 | Wada et al. ............... 318/293 |
| 5,861,775 | A | * | 1/1999 | Chen et al. ............... 330/69 |
| 5,920,189 | A | * | 7/1999 | Fisher et al. ............... 324/115 |
| 6,332,506 | B1 | * | 12/2001 | Kifuku ............... 180/443 |
| 6,459,972 | B2 | * | 10/2002 | Kodaka et al. ............... 701/43 |
| 6,476,671 | B1 | | 11/2002 | Tang |
| 6,570,360 | B1 | * | 5/2003 | Freeman ............... H02P 6/182 318/798 |
| 7,075,464 | B2 | * | 7/2006 | Hehn ............... 341/118 |
| 7,224,135 | B1 | * | 5/2007 | Menegoli ............... 318/400.26 |
| 7,292,095 | B2 | | 11/2007 | Burt et al. |

2013/0033209 A1   2/2013  Murata et al.

OTHER PUBLICATIONS

Burt, R. 2006. A Micropower Chopper-Stabilized Operational Amplifier Using a SC Notch Filter With Synchronous Integration Inside the Continuous-Time Signal Path. IEEE Journal of Solid-State Circuits, vol. 41, No. 12, Dec. 2006, pp. 2729-2736.

Linear Technology Corporation. 2007. LT6105: Precision, Extended Input Range Current Sense Amplifier. Technical Data Sheet, 20 pages.

Linear Technology Corporation. 2010. LT1999-10/LT1999-20/LT1999-50: High Voltage, Bidirectional Current Sense Amplifier. Technical Data Sheet. 24 page. (Revised Mar. 2012.).

Pertijs, M.A.P. et al. 2009. A 140dB-CMRR Current-Feedback Instrumentation Amplifier Employing Ping-Pong Auto-Zeroing and Chopping. 2009 IEEE International Solid-State Circuits Conference, 2009, Session 19, pp. 324-325.

European Patent Office. 2015. Extended European Search Report issued on Jan. 28, 2015 for European Patent Application No. EP 14 00 2828, published Feb. 25, 2015 as EP 2 840 407 A1 (European counterpart to instant application).

* cited by examiner

ACCURATE CURRENT SENSING IN H-BRIDGE APPLICATIONS WITHOUT AMPLIFIER HAVING HIGH COMMON MODE REJECTION RATIO

CROSS-REFERENCE TO RELATED APPLICATION

This application is based upon and claims priority to U.S. provisional patent application 61/866,334, entitled "Current Sensing for H-Bridge Applications," filed Aug. 15, 2013. The entire content of this application is incorporated herein by reference.

BACKGROUND

1. Technical Field

This disclosure relates to current sensing circuits, including current sensing circuits that control motors driven by an H-bridge of electronic switches.

2. Description of Related Art

The windings of a motor may each be driven by an H-bridge of electronic switches, which may be driven by a pulse-width-modulated (PWM) signal.

The system may need to continually measure the current flowing into (or out of) each motor winding. To effectuate this needed measurement, a shunt resistance may be placed in series with each winding, and the differential voltage across each shunt resistance may be measured and serve as an indication of the current that is traveling through it.

A differential amplifier may be used to measure the differential voltage across the shunt resistance. However, the differential voltage across the shunt resistance may be very low, while the common mode voltage of the shunt resistance—the instantaneous average of the voltages of the shunt resistance terminals with respect to ground—may vary widely as the H-bridge is switched by the PWM signal. This may cause errors in the measurements made by the differential amplifier.

To reduce these errors, the differential amplifier may have a high common mode voltage rejection ratio (CMRR). This may enable the differential amplifier to accurately track the differential voltage across the shunt resistance, even in the face of wide variations in the common mode voltage. However, difficult trade-offs between optimizing for DC accuracy (offset voltage) and AC performance (AC CMRR) may be needed.

Some H-bridge driven motor controllers may not directly measure the current in the motor winding. Instead, they may measure the current in either a ground or a supply connection to switches that form the H-bridge. However, the information provided by this approach may not be as accurate as directly measuring the current to the motor winding.

SUMMARY

A current sensing circuit may include a shunt resistance through which current to be sensed travels. A first and a second differential amplifier may each provide an amplified output of the voltage across the shunt resistance. A switching system may deliver a current sensing signal output based on the amplified output of the first differential amplifier when the common mode voltage across the shunt resistance is low and based on the amplified output of the second differential amplifier when the common mode voltage across the shunt resistance is high.

The first differential amplifier may provide its lowest output DC offset voltage when the common mode voltage is low, while the second differential amplifier may provide its lowest output DC offset voltage when the common mode voltage is high. The current sensing circuit may sense current that is controlled by one or more switches that switch at a switching frequency. The first and second differential amplifiers may both have a low common mode voltage rejection ratio at the switching frequency, such as a ratio of less than 40 dB.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1:
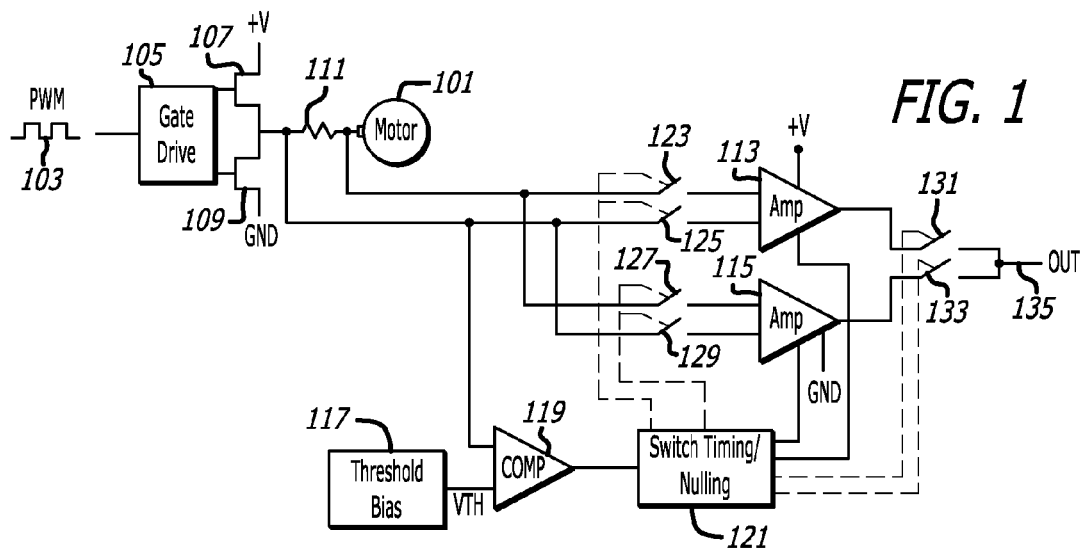
FIG. 1 is an example of a motor and an H-bridge circuit for driving a winding of the motor that includes a current sense circuit that does not require a differential amplifier with a high common mode rejection ratio.

FIG. 1 is an example of a motor 101 and a circuit for driving a winding of the motor 101 that may include a pulse-width-modulated (PWM) drive signal 103, a gate drive circuit 105, H-bridge switches 107 and 109, and a current sensing circuit. The current sensing circuit accurately measures current to the motor 101 and may include a shunt resistance 111, differential amplifiers 113 and 115, and a switching system that includes a threshold bias circuit 117, a comparator 119, a switch timing/nulling circuit 121, and electronic switches 123, 125, 127, 129, 131, and 133.

The motor 101 may be of any type. For example, the motor may be a DC motor whose torque is proportional to input current. The motor 101 may have several windings. Each winding may be driven by an additional instance of the circuit illustrated in FIG. 1.

The H-bridge switches 107 and 109 may be electronic switches, such as MOSFETs that may be driven at a switching frequency. The gate drive circuit 105 may be configured to actuate the H-bridge switches 107 and 109 so as to cause the winding of the motor 101 to be alternatingly connected to a high and a low voltage, such as to a positive supply voltage +V and to ground, in synchronism with state changes of the PWM drive signal 103. For example, the gate drive circuit 105 may be configured to cause the winding of the motor 101 to be connected to +V when the PWM drive signal 103 is high and to ground when the PWM drive signal 103 is low.

The PWM drive signal 103 may be generated by a drive circuit (not shown) that causes the PWM drive signal 103 to have a frequency and/or duty cycle that causes the motor 101 to operate in a particular desired way, such as at a particular position, speed, and/or acceleration. To facilitate this, information about the current that is traveling through the motor 101 may be needed by the drive circuit that generates the PWM drive signal 103. This current information may be obtained by measuring the voltage across the shunt resistance 111. The shunt resistance 111 may be a single resistor, a set of resistors, and/or one or more other types of components that have a resistance. The value of the resistance may be low, so as not to cause a large voltage drop and hence energy loss.

The average of the voltage at the input of the shunt resistance 111 and the voltage at the output of the shunt resistance 111 is known as the common mode voltage. This common mode voltage may be very low when the motor winding is connected to ground through the H-bridge switch 109, while it may be very high when the motor winding is connected to +V through the H-bridge switch 107.

Both differential amplifiers 113 and 115 may be configured to provide an amplified output of the voltage across the shunt resistance 111 when connected across the shunt resistance 111. However, the differential amplifier 113 may be optimized to provide its lowest output DC offset voltage when the common mode voltage is low (e.g., ground). Conversely, the differential amplifier 115 may be optimized to provide its lowest output DC offset voltage when the common mode voltage is high (e.g., +V). When in this configuration, both of the differential amplifiers 113 and 115 may have a small common mode rejection ratio, such as a ratio that is less than 40 dB at the switching frequency.

The switching system may be configured to cause a current sensing signal output 135 to be based on the amplified output of the first differential amplifier 113 and not the amplified output of the second differential amplifier 115 when the common mode voltage across the shunt resistance 111 is low (e.g., ground). Conversely, the switching system may be configured to cause the current sensing signal output 135 to be based on the amplified output of the second differential amplifier 115 and not the amplified output of the first differential amplifier 113 when the common mode voltage across the shunt resistance 111 is high (e.g., +V).

Amplifiers 113 and 115 may each have connections to +V and GND, unlike as is illustrated in FIG. 1. In that case, either may be used as the high common mode amplifier or the low common mode amplifier interchangeably. One amplifier might instead be connected to a low voltage, such as 5V and ground, while the other might instead be connected to +V and a voltage near +V, such as (+V-5V). In this case, the amplifier tied to +V may serve as the high common mode voltage amplifier, while the one tied to ground may serve as the low common mode amplifier. When connected as shown in FIG. 1, the amplifier 113 may be active when the common mode voltage is high, while the amplifier 115 may be active when the common mode voltage is low.

The switching system may employ any means to facilitate this functionality. For example, the threshold bias circuit 117 may generate a reference voltage and the comparator 119 may compare that reference voltage with a voltage on the shunt resistance 111, such as the voltage at the input to the shunt resistance 111. When above the reference voltage, the output of the comparator 119 may cause the switch timing/nulling circuit 121 to cause the voltage across the shunt resistance 111 to be amplified by only the differential amplifier 113 by causing switches 123, 125, and 131 to close, while causing switches 127, 129, and 133 to open. Conversely, when above the reference voltage, the output of the comparator 119 may cause the switch timing/nulling circuit 121 to cause the voltage across the shunt resistance 111 to be amplified by only the differential amplifier 115 by causing switches 123, 125, and 131 to open, while causing switches 127, 129, and 133 to close. The switches 123, 125, 127, 129, 131, and 133 may be any type of electronic switches, such as MOSFETs.

In a different configuration, there may not be switches 123, 125, 127, or 129. Instead, the inputs to the differential amplifiers 113 and 115 may both always be connected across the shunt resistance 111. The switching could instead be internal to a single chip containing both amplifiers.

By ping-ponging the differential amplifiers 113 and 115 back and forth, each may amplify the differential voltage across the shunt resistance 111 only when the differential amplifier is best matched to the common mode voltage of the shunt resistance 111, i.e., at a time when the common mode voltage is low (e.g., ground) for the differential amplifier 113 that is optimized for low common mode voltages, and at a time when the common mode voltage is high (e.g., +V) for the differential amplifier 115 that is optimized for high common mode voltages.

The switch timing/nulling circuit 121 may automatically adjust the differential amplifiers 113 and 115 so as to cause their outputs to be zero when there is no differential voltage at their inputs. The switch timing/nulling circuit 121 may be configured to perform this function repeatedly during the course of the operation of the current sensing circuit, thereby compensating for drift in this zero output caused by temperature changes, component aging, and/or other reasons.

The switch timing/nulling circuit 121 may implement any approach for effectuating this auto zeroing function. For example, the switch timing/nulling circuit 121 may be configured to zero each of the differential amplifiers 113 and 115 when they are not being used to measure the voltage across the shunt resistance 111, e.g., when the input to the differential amplifier that is being nulled is disconnected from the shunt resistance 111 by opening the switches that connect the differential amplifier to the shunt resistance 111, thereby causing the voltage at the input of the differential amplifier to be zero. The switch timing/nulling circuit 121 may then examine the output of the disconnected differential amplifier and provide a compensating input to the differential amplifier that causes its output to also be at zero. Example of such nulling approaches may be found in U.S. Pat. No. 4,633,642 and European patent 1,428,314. All or any portion of the switch timing/nulling circuit 121 could be part of the amplifiers 113 and/or 115.

In order to synchronize nulling of the differential amplifiers, a clock that runs at a multiple of the frequency of the PWM drive signal 103 may be used to provide non-overlapping clocks. A PLL/frequency synthesizer or other type of circuit that can produce a multiple (e.g., doubling or quadrupling) of this frequency from the PWM drive signal 103 or from another signal may be used.

The switch timing/nulling circuit 121 may instead be configured to null each of the differential amplifiers 113 and 115 while they are measuring the voltage across the shunt resistance 111. Examples of nulling approaches that may be used may be found in U.S. Pat. No. 7,292,095; "140 dB-CMMR Current-Feedback Instrumentation Amplifier Employing Ping-Pong Auto-Zeroing and Chopping," a paper presented at the 2009 IEEE International Solid-State Circuits Conference; and "A Micro Power Chopper-Stabilized Operational Amplifier Using A SC Notch Filter With Synchronous Integration Inside The Continuous-Time Signal Path," IEEE Journal of Solid-State Circuits, Vol. 41, No. 12, Dec. 2006.

Figure 2:
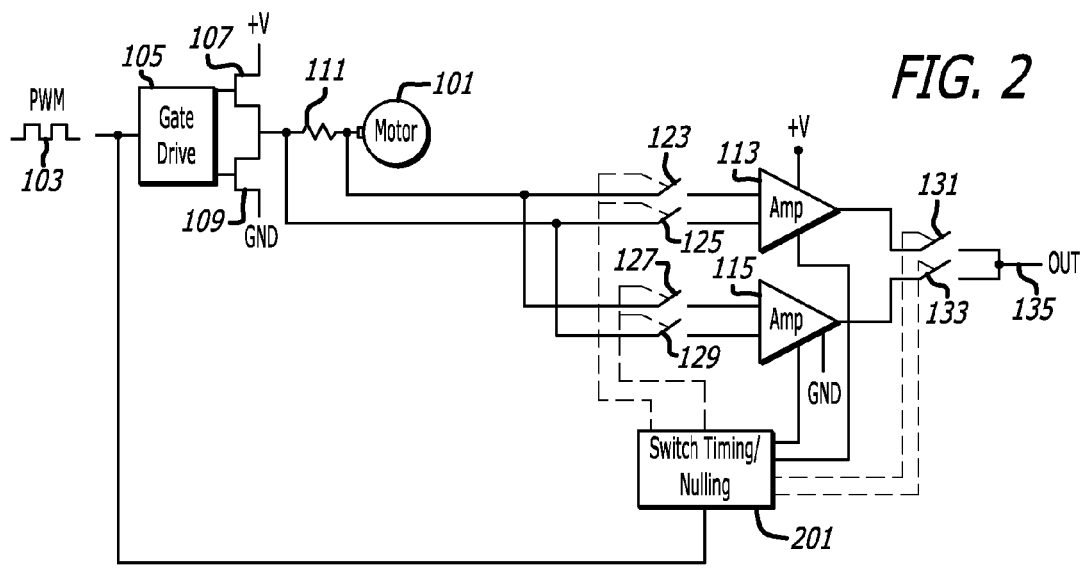
FIG. 2 is an example of a motor and an H-bridge circuit for driving a winding of the motor that includes a current sense circuit that is similar to the one in FIG. 1, but that senses the common mode voltage indirectly, as compared to directly.

FIG. 2 is an example of the motor 101 and a circuit for driving a winding of the motor that includes a current sense circuit that is similar to the one in FIG. 1, but that senses the common mode voltage indirectly, as compared to directly. Except as now described, the components in the circuit illustrated in FIG. 2 may be the same as those in FIG. 1, as described above.

Unlike in FIG. 1, the circuit in FIG. 2 may have a switch timing/nulling circuit 201 that senses the common mode voltage indirectly, as compared to directly. More specifically, the switch timing/nulling circuit 201 may utilize the PWM drive signal 103 to determine whether the common mode voltage across the shunt resistance 111 is high (e.g., +V) or low (e.g., ground). For example, it may deem each rising edge in the PWM drive signal 103 as indicating a change to a high common mode voltage (e.g., +V), while it may deem each falling edge in the PWM drive signal 103 as indicating a change to a low common mode voltage (e.g., ground). Except for this difference, the switch timing/nulling circuit 201 may be the same as the switch timing/nulling circuit 121 illustrated in FIG. 1 and discussed above.

Figure 3:
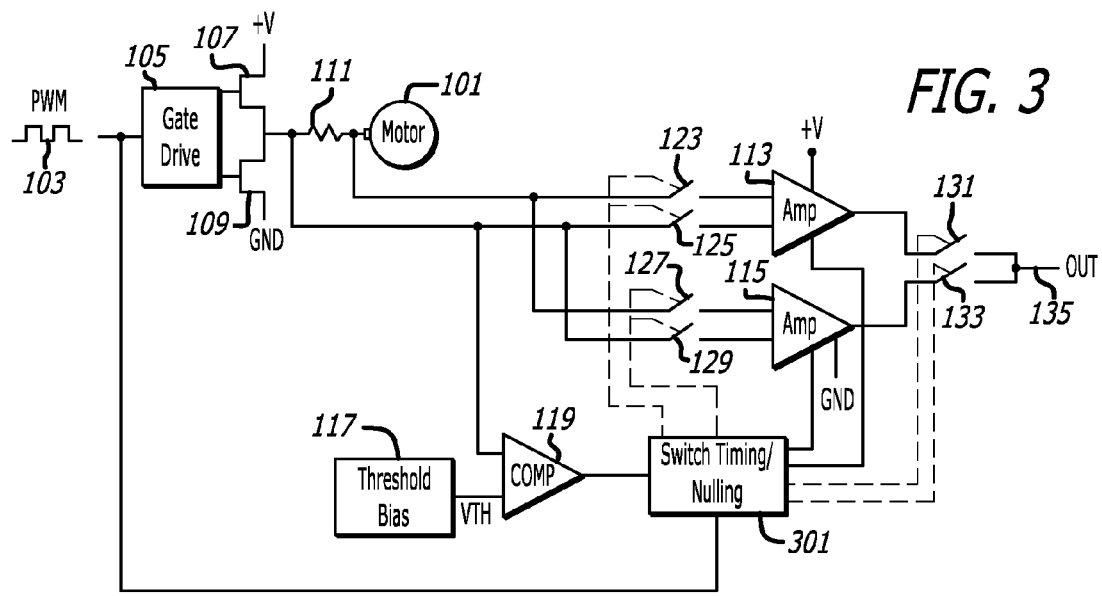
FIG. 3 is an example of a motor and an H-bridge circuit for driving a winding of the motor that includes a current sense circuit that senses the common mode voltage both directly as in FIG. 1 and indirectly as in FIG. 2.

FIG. 3 is an example of the motor 101 and a circuit for driving a winding of the motor that includes a current sense circuit that senses the common mode voltage both directly as in FIG. 1 and indirectly as in FIG. 2. Except as now described, the components in the circuit illustrated in FIG. 3 may be the same as those in FIG. 1, as described above.

Unlike in FIG. 1, the circuit in FIG. 3 may have a switch timing/nulling circuit 301 that senses whether the common mode voltage is high (e.g., +V) or low (e.g., ground) based on both the output of the comparator 119 (a direct measurement) and the PWM drive signal 103 (an indirect measurement). More specifically, the switch timing/nulling circuit 301 may switch in the differential amplifier 113 so that it can begin measuring the voltage across the shunt resistance 111 when the voltage on the shunt resistance 111 drops below the voltage produced by the threshold bias circuit 117; may switch out the differential amplifier 113 so that it stops measuring the voltage across the shunt resistance 111 when there is an upward transition in the PWM drive signal 103; may switch in the differential amplifier 115 so that it begins measuring the voltage across the shunt resistance 111 when the voltage on the shunt resistance 111 rises above the voltage produced by the threshold bias circuit 117; and may switch out the differential amplifier 115 so that it stops measuring the voltage across the shunt resistance 111 when there is a downward transition in the PWM drive signal 103. Except for this difference, the switch timing/nulling circuit 301 may be the same as the switch timing/nulling circuit 121 illustrated in FIG. 1 and discussed above.

Figure 4:
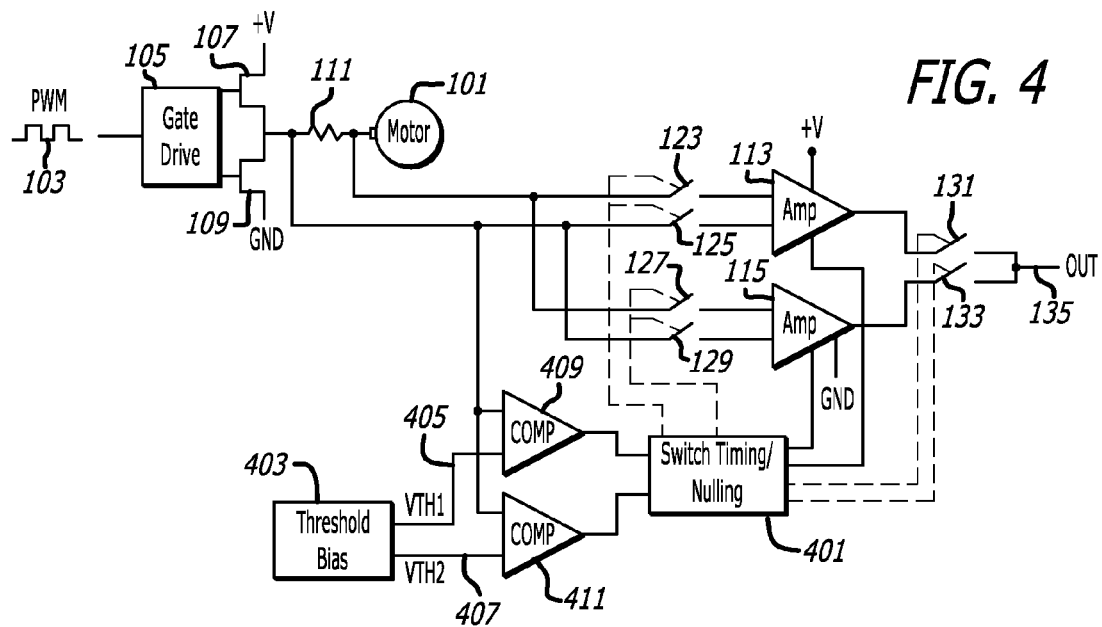
FIG. 4 is an example of a motor and an H-bridge circuit for driving a winding of the motor that includes a current sense circuit that is similar to the one in FIG. 1, but that uses two comparators to sense whether the common mode voltage is high or low, as compared to a single comparator.

FIG. 4 is an example of the motor 101 and a circuit for driving a winding of the motor 101 that includes a current sense circuit that is similar to the one in FIG. 1, but that uses two comparators to sense whether the common mode voltage is high or low, as compared to a single comparator. Except as now described, the components in the circuit illustrated in FIG. 4 may be the same as those in FIG. 1, as described above.

Unlike in FIG. 1, a threshold bias circuit 403 may generate both a high reference voltage 405 and a low reference voltage 407. The high reference voltage 405 may be compared by a comparator 409 with the voltage on the shunt resistance 111. Similarly, the low reference voltage 407 may be compared by a comparator 411 with a voltage on the shunt resistance 111. A switch timing/nulling circuit 401 may be configured to control the switches 123, 125, 127, 129, 131, and 133 in the same manner as the switch timing/nulling circuit 121. Notwithstanding, the switch timing/nulling circuit 401 may be configured not to switch in the differential amplifier 113 until the voltage on the shunt resistance 111 drops below the low reference voltage 407, as signaled by the comparator 411. Similarly, the switch timing/nulling circuit 401 may be configured not to switch in the differential amplifier 115 until the voltage on the shunt resistance 111 rises above the high reference voltage 405, as signaled by the comparator 409. The switch timing/nulling circuit 401 may be configured to disconnect both differential amplifiers 113 and 115 during a brief period of time when the voltage on the shunt resistance 111 transitions between the low reference voltage 407 and the high reference voltage 405, as signaled by comparators 409 and 411. Except for this difference, the switch timing/nulling circuit 401 may be the same as the switch timing/nulling circuit 121 illustrated in FIG. 1 and discussed above.

Figure 5:
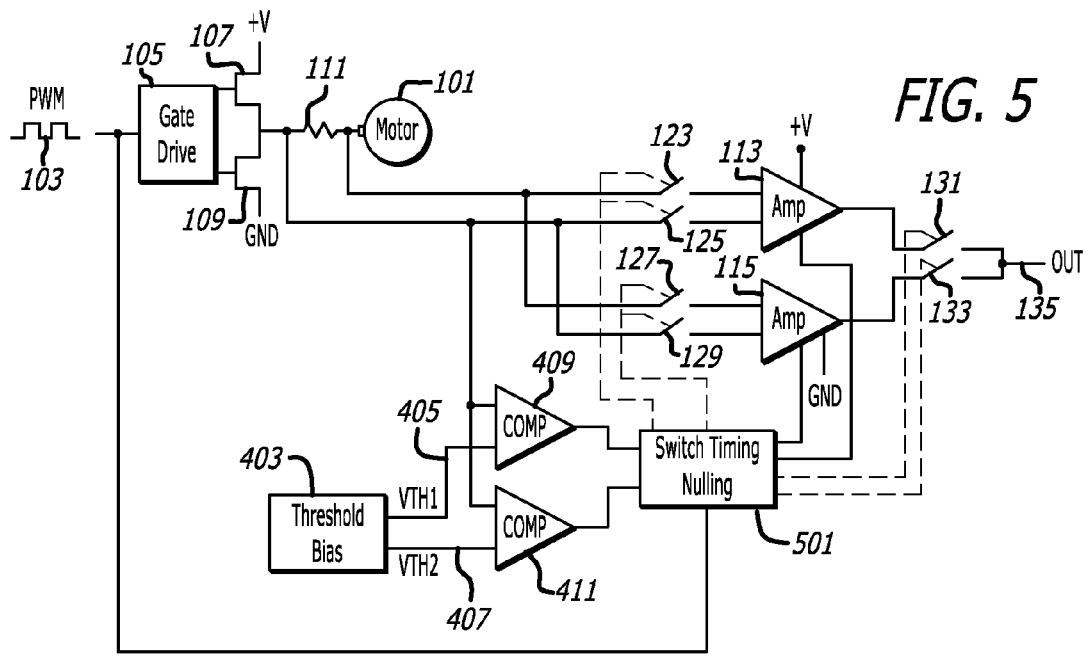
FIG. 5 is an example of a motor and an H-bridge circuit for driving a winding of the motor that includes a current sense circuit that combines the dual comparator feature of the circuit shown in FIG. 4 with the dual input signals of FIG. 3.

FIG. 5 is an example of the motor 101 and a circuit for driving a winding of the motor 101 that includes a current sense circuit that combines the dual comparator feature of the circuit shown in FIG. 4 with the dual input signals of FIG. 3. Except as now described, the components in the circuit illustrated in FIG. 5 may be the same as those in FIGS. 3 and 4, as described above.

More specifically, a switch timing/nulling circuit 501 may be configured to switch in the differential amplifier 113 so that it can begin measuring the voltage across the shunt resistance 111 when the voltage on the shunt resistance 111 drops below the low reference voltage 407 as detected by the comparator 411; may switch out the differential amplifier 113 so that it stops measuring the voltage across the shunt resistance 111 when there is an upward transition in the PWM drive signal 103; may switch in the differential amplifier 115 so that it begins measuring the voltage across the shunt resistance 111 when the voltage on the shunt resistance 111 rises above the high reference voltage 405 as detected by the comparator 409; and may switch out the differential amplifier 115 so that it stops measuring the voltage across the shunt resistance 111 when there is a downward transition in the PWM drive signal 103. Except for this difference, the switch timing/nulling circuit 501 may be the same as the switch timing/nulling circuit 121 illustrated in FIG. 1 and discussed above.

Figure 6:
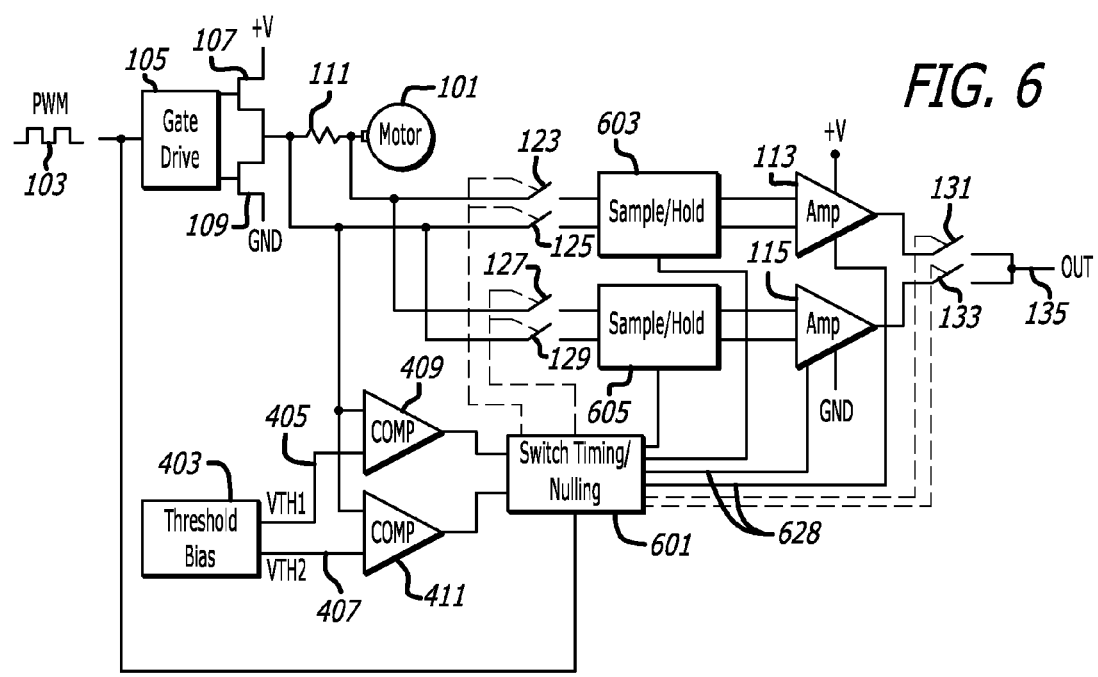
FIG. 6 is an example of a motor and an H-bridge circuit for driving a winding of the motor that includes a current sense circuit that is similar to the one in FIG. 5, but that uses sample and hold circuits to preserve inputs to differential amplifiers.

FIG. 6 is an example of the motor 101 and a circuit for driving a winding of the motor 101 that includes a current sense circuit that is similar to the one in FIG. 5, but that uses sample and hold circuits 603 and 605 to preserve the inputs to the differential amplifiers 113 and 115. Except as now described, the components in the circuit illustrated in FIG. 6 may be the same as those in FIG. 5, as described above.

A switch timing/nulling circuit 601 may be configured to control the sample and hold circuits 603 and 605 so as to cause them to each sample the voltage across the shunt resistance 111 at the end of the period when the differential amplifier to which the sample and hold circuit is amplifying the voltage across the shunt resistance 111. The switch timing/nulling circuit 601 may be configured to control the sample and hold circuits 603 and 605 so as to cause them to each hold that sampled voltage at the input to its differential amplifier while its differential amplifier is not amplifying the voltage across the shunt resistance 111. Except for this additional functionality, the switch timing/nulling circuit 601 may be the same as the switch timing/nulling circuit 501. A track and hold circuit may be used instead of one or both of the sample and hold circuits 603 and 605.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, instead of connecting a comparator input directly to the shunt resistance 111, the voltage on the shunt resistance 111 may first be attenuated using, for example, a resistive divider, so that a lower threshold voltage may be applied to the comparator reference input. Instead of using switches 131 and 133 at the output of the differential amplifiers, the differential amplifiers may be configured such that the switch timing/nulling circuit can set the output of a differential amplifier in a high-impedance state, so that the output 135 of the circuit may be derived, in turn, from the differential amplifier which is not set in a high-impedance state, using a technique commonly referred to as "wired-or" connecting of two outputs. Comparators may also be used to detect fault conditions, such as a disconnected sense resistance or a shorted winding. The amplifiers may be designed such that the inputs must stay within the supplies, or such that the inputs may operate outside of the supplies, allowing for supply voltages that are substantially lower than the motor winding voltages. The amplifiers may operate from the same set of power supplies, or power supplies tailored to the common-mode voltages that correspond to the active periods of each amplifier's operation. The amplifiers may null at frequencies that are higher than, lower than, or synchronized to the common-mode switch frequency. The nulling may include spread-spectrum or other clock-feed through reduction techniques.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A current sensing circuit comprising:
    a shunt resistance through which current to be sensed travels;
    a first differential amplifier that provides an amplified output of the voltage across the shunt resistance;
    a second differential amplifier that provides an amplified output of the voltage across the shunt resistance and that is not the first differential amplifier; and
    a switching system that delivers a current sensing signal output based on:
        the amplified output of the first differential amplifier and not the amplified output of the second differential amplifier when the common mode voltage of the shunt resistance is low; and
        the amplified output of the second differential amplifier and not the amplified output of the first differential amplifier when the common mode voltage of the shunt resistance is high.

2. The current sensing circuit of claim 1 wherein the current sensing circuit senses current that is controlled by one or more switches that switch at a switching frequency and the first and second differential amplifiers both have a common mode voltage rejection ratio of less than 40 db at the switching frequency.

3. The current sensing circuit of claim 1 wherein:
the first differential amplifier provides its lowest output DC offset voltage when the common mode voltage is low and not when it is high; and
the second differential amplifier provides its lowest output DC offset voltage when the common mode voltage is high and not when it is low.

4. The current sensing circuit of claim 1 wherein the switching system changes the differential amplifier on which it bases the current sensing signal output based on a comparison of a voltage on the shunt resistance with a reference voltage.

5. The current sensing circuit of claim 4 wherein the switching system bases the current sensing signal output on:
the amplified output of the first differential amplifier and not the amplified output of the second differential amplifier when the voltage across the shunt resistance is less than a low reference voltage; and
the amplified output of the second differential amplifier and not the amplified output of the first differential amplifier when the voltage across the shunt resistance is greater than a high reference voltage that is higher than the low reference voltage.

6. The current sensing circuit of claim 4 further comprising:
a first hold circuit that holds the value of a voltage on the shunt resistance when the common mode voltage of the shunt resistance is low while the common mode voltage of the shunt resistance is high; and
a second hold circuit that holds the value of a voltage on the shunt resistance when the common mode voltage of the shunt resistance is high while the common mode voltage of the shunt resistance is low.

7. The current sensing circuit of claim 1 wherein the sensing circuit is used for sensing the current delivered by an H-bridge that is driven by a switching signal and wherein the switching system changes the differential amplifier on which it bases the current sensing signal output based on the switching signal.

8. The current sensing circuit of claim 7 wherein the switching system also changes the differential amplifier on which it bases the current sensing signal output based on a comparison of a voltage at a terminal of the shunt resistance with a reference voltage.

9. The current sensing circuit of claim 8 wherein the switching system also bases the current sensing signal output on:
the amplified output of the first differential amplifier and not the amplified output of the second differential amplifier when the voltage at a terminal of the shunt resistance is less than a low reference voltage; and
the amplified output of the second differential amplifier and not the amplified output of the first differential amplifier when the voltage at a terminal of the shunt resistance is greater than a high reference voltage that is higher than the low reference voltage.

10. The current sensing circuit of claim 8 wherein the switching system:
begins basing the current sensing signal output on the amplified output of the first differential amplifier when the voltage at a terminal of the shunt resistance is less than a first reference voltage;
ends basing the current sensing signal output on the amplified output of the first differential amplifier when there is a transition in the switching signal;
begins basing the current sensing signal output on the amplified output of the second differential amplifier when the voltage at a terminal of the shunt resistance is greater than a second reference voltage; and
ends basing the current sensing signal output on the amplified output of the second differential amplifier when there is a transition in the switching signal.

11. The current sensing circuit of claim 10 wherein the first and the second reference voltages are the same.

12. The current sensing circuit of claim 10 wherein the first reference voltage is lower than the second reference voltage.

13. The current sensing circuit of claim 1 wherein the switching system includes one or more electronic switches that switch the current sensing signal output between the amplified output of the first differential amplifier and the amplified output of the second differential amplifier.

14. The current sensing circuit of claim 1 wherein:
the first differential amplifier has an input;
the second differential amplifier has an input; and
the switching system includes one or more electronic switches that switch the voltages at the terminals of the shunt resistance between the inputs of the first and the second differential amplifiers.

15. The current sensing circuit of claim 14 further comprising:
a first hold circuit that retains the value of the voltages at the input to the first differential amplifier when switched to the input of the first differential amplifier after being switched to the input of the second differential amplifier; and
a second hold circuit that retains the value of the voltages at the input to the second differential amplifier when switched to the input of the second differential amplifier after being switched to the input of the first differential amplifier.

16. The current sensing circuit of claim 14 wherein the switching system includes one or more electronic switches that switch the current sensing signal output between the amplified output of the first differential amplifier and the amplified output of the second differential amplifier.

17. The current sensing circuit of claim 1 further comprising a nulling circuit that adjusts the first and the second differential amplifiers so that their respective amplified outputs are substantially zero when the voltage across the shunt resistance is substantially zero.

18. The current sensing circuit of claim 17 wherein the nulling circuit:
adjusts the first differential amplifier when the current sensing signal output is based on the output of the second differential amplifier; and
adjusts the second differential amplifier when the current sensing signal output is based on the output of the first differential amplifier.

19. The current sensing circuit of claim 17 wherein the nulling circuit adjusts the first and the second differential amplifiers at substantially the same time.

20. A circuit for driving a winding of a motor comprising:
an H-bridge of switches;
a shunt resistance between the H-bridge of switches and the winding of the motor;
a first differential amplifier that provides an amplified output of the voltage across the shunt resistance;

a second differential amplifier that provides an amplified output of the voltage across the shunt resistance and that is not the first differential amplifier; and a switching system that delivers a current sensing signal output based on:

the amplified output of the first differential amplifier and not the amplified output of the second differential amplifier when the common mode voltage of the shunt resistance is low; and the amplified output of the second differential amplifier and not the amplified output of the first differential amplifier when the common mode voltage of the shunt resistance is high.

\* \* \* \* \*